United States Patent
Kim et al.

(10) Patent No.: US 6,716,717 B2
(45) Date of Patent: Apr. 6, 2004

(54) METHOD FOR FABRICATING CAPACITOR OF SEMICONDUCTOR DEVICE

(75) Inventors: Kyong Min Kim, Kyoungki-do (KR); Dong Jun Kim, Kyoungki-do (KR)

(73) Assignee: Hynix Semiconductor Inc., Ich'on (KR)

( * ) Notice: Subject to any disclaimer, the term of this patent is extended or adjusted under 35 U.S.C. 154(b) by 207 days.

(21) Appl. No.: 09/867,527

(22) Filed: May 31, 2001

(65) Prior Publication Data
US 2002/0048876 A1 Apr. 25, 2002

(30) Foreign Application Priority Data
Jun. 1, 2000 (KR) ............................ 2000-30084

(51) Int. Cl.$^7$ .............................................. H01L 21/20
(52) U.S. Cl. .................. 438/396; 438/240; 438/253; 438/785; 438/786
(58) Field of Search ................ 438/396, 240, 438/253, 785, 786

(56) References Cited

U.S. PATENT DOCUMENTS

| | | | |
|---|---|---|---|
| 6,338,995 B1 * | 1/2002 | Hwang et al. | 438/240 |
| 6,340,622 B1 * | 1/2002 | Lee et al. | 438/396 |
| 6,410,381 B2 * | 6/2002 | Kim et al. | 438/240 |
| 6,458,645 B2 * | 10/2002 | DeBoer et al. | 438/240 |
| 2002/0025646 A1 * | 2/2002 | Kim et al. | 438/396 |

* cited by examiner

Primary Examiner—Amir Zarabian
Assistant Examiner—Christy Novacek
(74) Attorney, Agent, or Firm—Finnegan, Henderson, Farabow, Garrett & Dunner, L.L.P.

(57) ABSTRACT

Disclosed herein is a method for the fabrication of a capacitor of semiconductor device, which is capable of increasing a charge storage capacitance of the capacitor while preventing generation of leakage current in the capacitor. The disclosed method comprises comprising the steps of: forming a ruthenium film as a lower electrode on a semiconductor substrate; depositing an amorphous TaON film having an excellent dielectric constant on the ruthenium film; subjecting the resulting substrate to a first thermal treatment to prevent oxidation of the lower electrode and to remove carbons present in the amorphous TaON thin film; subjecting the resulting substrate to a second thermal treatment to crystallize the amorphous TaON thin film; and forming a metal film as a metal film on the crystalline TaON film.

11 Claims, 2 Drawing Sheets

METHOD FOR FABRICATING CAPACITOR OF SEMICONDUCTOR DEVICE

CROSS-REFERENCE TO RELATED APPLICATIONS

This application claims priority from Korean Patent Application No. 2000-30084, filed Jun. 1, 2000, the entirety of which is incorporated herein by reference.

BACKGROUND OF THE INVENTION

1. Field of the Invention

The present invention relates in general to a method for the fabrication of a capacitor of a memory device, and more particularly to a method of fabricating a capacitor of a semiconductor device, which is capable of increasing a charge storage capacitance of the capacitor while preventing generation of leakage current in the capacitor.

2. Description of the Related Art

With recent advances in semiconductor fabrication technology, a demand for memory devices increases rapidly. In semiconductor devices, a capacitor being used as a data storage element is varied in its capacitance depending on the area of its electrodes, the distance between the electrodes, and the dielectric constant of the dielectric film interposed between the electrodes.

For these reasons, there has been generally applied a capacitor that has a TaON thin film having an excellent dielectric constant. This capacitor has a polysilicon film, as a lower electrode, that is generally treated by RTN (Rapid Thermal Nitridation) at its surface. However, with a gradual increase in the integration density of the semiconductor device, a capacitance per cell required for stable device operation remains unchanged, whereas the cell size of the capacitor is gradually decreased.

Moreover, the TaON thin film capacitor structure having, as a lower electrode, the polysilicon film of about 30 Å thickness corresponding to an effective oxide film thickness, has a limitation with respect to its capacitance. Thus, in order to maximize the capacitance of the TaON thin film capacitor, a metal film other than the polysilicon film has been formed as a lower electrode to form a capacitor structure of metal film-dielectric film-metal film (MIM).

However, if the metal film is formed as the lower electrode as described above, the metal film is then oxidized during thermal process following depositing a TaON thin film having an excellent dielectric constant on the metal film. This has a significant effect on a lifting or leakage current characteristic of the TaON thin film. Thus, in the prior art, the TaON thin film is treated by RTP (Rapid Thermal Processing) using an $O_2$ gas at low temperature or by plasma excited in an $O_2$ gas, to prevent oxygen deficiency in the thin film or to remove carbons present in the thin film. However, the fabricating method of the capacitor of the semiconductor device according to the prior art suffers from problems as described below.

In the fabricating method of the capacitor according to the prior art, when the deposited TaON thin film is treated by the subsequent thermal process using an $O_2$ gas or by plasma excited in the $O_2$ gas, the $O_2$ gas has a slow activation speed as compared to other gases containing oxygen, so that it becomes slow in its reaction with precursors for the TaON film. Thus, the TaON thin film has oxygen deficiency and carbons present therein. This results in generation of leakage current in the TaON film, thereby deteriorating electrical properties of the capacitor.

SUMMARY OF THE INVENTION

The present invention solves prior problems and provides a fabricating method of a capacitor of a semiconductor device, which is capable of improving a leakage current characteristic of the capacitor having a TaON thin film.

Additionally, the present invention provides a fabricating method of a capacitor of a semiconductor device, which can increase a charge storage capacitance of the capacitor and thus makes the capacitor suitable for application in a highly integrated semiconductor device.

In one embodiment, the present invention provides a fabricating method of a capacitor of a semiconductor device, comprising the steps of: forming a ruthenium film as a lower electrode on a semiconductor substrate; depositing an amorphous TaON film having an excellent dielectric constant on the ruthenium film; subjecting the resulting substrate to a first thermal treatment to prevent oxidation of the lower electrode and to remove carbons present in the amorphous TaON thin film; subjecting the resulting substrate to a second thermal treatment to crystallize the amorphous TaON film; and forming an upper electrode on the crystalline TaON film.

In another embodiment, the present invention provides a fabricating method of a capacitor of a semiconductor device, comprising the steps of: forming a ruthenium film as a lower electrode on a semiconductor substrate; forming an amorphous TaON thin film having an excellent dielectric constant on the ruthenium film; subjecting the resulting substrate to a first thermal treatment using a plasma to prevent oxidation of the lower electrode and to remove carbons present in the amorphous TaON thin film; subjecting the resulting substrate to a second thermal treatment using a RTP annealing to crystallize the amorphous TaON film; and forming an upper electrode on the crystalline TaON film.

DETAILED DESCRIPTION OF THE INVENTION

A preferred embodiment of a fabricating method of a capacitor in a semiconductor device according to the present invention will now be described in detain with reference to the accompanying drawings.

Figure 1:
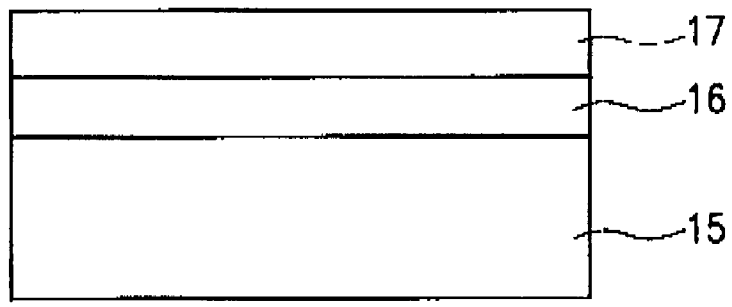
FIGS. 1, 2, and 3 are cross-sectional views for describing a fabricating method of a capacitor of a semiconductor device according to the present invention.
Figure 2:
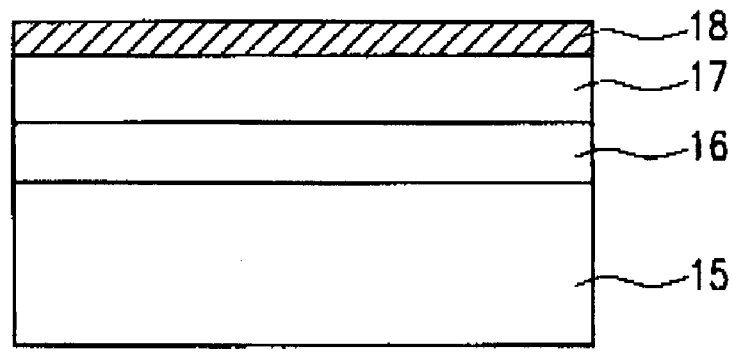
Figure 3:
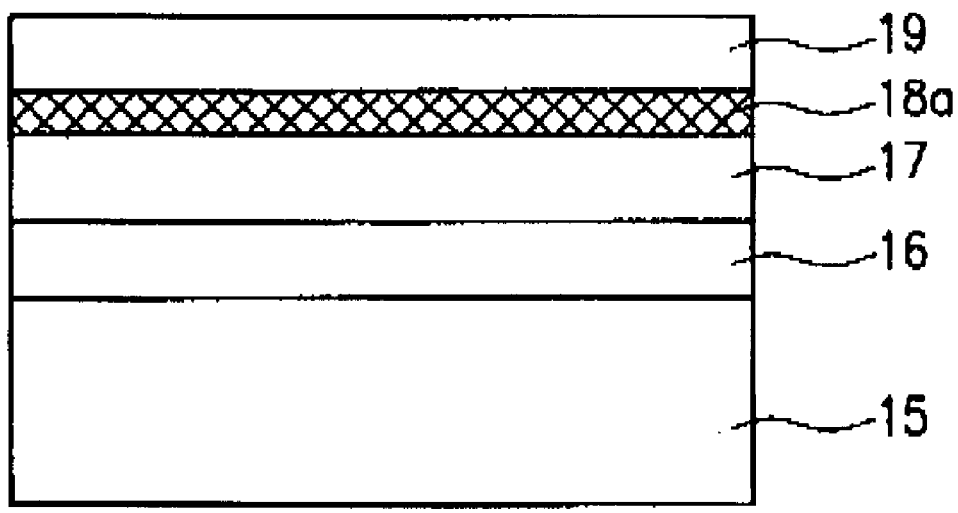

FIGS. 1, 2, and 3 are cross-sectional views showing a fabricating method of a capacitor of a semiconductor device according to the present invention.

Although not shown in Figures, the method according to the present invention includes, on a semiconductor device (not shown) having a MOS transistor (not shown), forming an interlayer insulating film (not shown) having a contact hole (not shown) through which one of junction regions (not shown) of the MOS transistor is exposed.

Then, as shown in FIG. 1, a plug polysilicon 15 is filled in the contact hole (not shown) of the interlayer insulating film. Next, the polysilicon film 15 is etched back at its surface using a HF solution or a buffer oxide as an etching regent to remove a native oxide film.

Following this, on the polysilicon 15, there are deposited a Ti film and a TiN film to a thickness of 100 Å to 500 Å, respectively, thereby forming a barrier metal film 16. The barrier metal film 16 is then subjected to Chemical Mechanical Polishing (CMP) until the interlayer insulating film is exposed.

Afterwards, on the barrier film 16 is deposited a ruthenium film 17 as a lower deposition. At this time, the ruthenium film is preferably deposited to have a thickness of 100 Å to 2,000 Å.

Then, as shown in FIG. 2, on the ruthenium film 17 is deposited an amorphous TaON thin film 18 having an excellent dielectric constant. At this time, tantalum ethylate ($Ta(OC_2H_5)_5$) is used as a tantalum source. As $Ta(OC_2H_5)_5$ is present in liquid phase as known in the art, it must be supplied into a Low Pressure Chemical Vapor Deposition (LPCVD) chamber after being transformed into vapor phase.

Also, for formation of the TaON film 18, $Ta(OC_2H_5)_5$) as the tantalum source is vaporized in a vaporizer at a temperature of 170 to 190° C. to produce a Ta chemical vapor. The Ta chemical vapor is reacted with a $NH_3$ gas in the LPCVD chamber which is maintained under at a pressure of 0.1 to 2 Torr and at a temperature of 350 to 450° C. and into which the $NH_3$ gas is supplied at a flow rate of 10 to 1,000 Standard Cubic Centimeters per minute (SCCM). This reaction gives the amorphous TaON film 18.

Next, as shown in FIG. 3, the resulting substrate is subjected to a first thermal treatment to prevent the oxidation of the ruthenium film 17 as the lower film and to remove carbon present in the TaON thin film 18, and then is subjected to a second thermal treatment to crystallize the TaON thin film 18. The first thermal treatment of the TaON thin film is a step of treating the TiON thin film with plasma excited in $O_3$ and $NH_3$ gases. During this first thermal treatment, a chamber is maintained at a pressure of several tens Torr to several hundreds Torr, a sub-heater is maintained at a temperature of 300 to 400° C., a RF power is in the range of 50 Watt to 400 Watt, and a thermal treatment time is in the range of 1 min. to 20 min. Also, the RF power is applied to a ground for the sub-heater, and is applied to an electrode for a showerhead. Further, the $O_3$ gas is used at a concentration of 10,000 ppm to 200,000 ppm, and the $NH_3$ gas is used at a flow rate of 10 SCCM to 1000 SCCM.

Meanwhile, the second thermal treatment step is carried out by subjecting the resulting substrate to RTP (Rapid Thermal Processing) annealing at a temperature of 500 to 600° C. for 30 to 60 seconds using a $N_2$ or $O_2$ gas of a flow rate of 1 to 10 Standard Liters per minute (SLM). This second thermal treatment step crystallizes the TaON film 18, thereby forming a crystalline TaON thin film 18a.

Then, on the crystalline TaON thin film 18a is deposited an upper electrode 19, such as a ruthenium film or a TiN film, to complete a capacitor of a semiconductor device.

Meanwhile, the method of the present invention may also be applied to the fabrication of, for example, a cylinder structure capacitor, without departing the sprit and scope of the present invention.

As described above, the fabricating method of the present invention includes the first thermal treatment step of thermally treating the substrate using a plasma excited in $O_3$ and $NH_3$ gases at a temperature of 300 to 400° C. to prevent the oxidation of the lower film and to remove carbons present in the TaON thin film, and the second thermal treatment step of RTP annealing the substrate using $N_2$ or $O_2$ gas at a temperature of 500 to 600° C. to crystallize the TaON thin film. Thus, the method of the present invention can improve a leakage current characteristic of the TaON capacitor by the prevention of the oxidation of the lower electrode, the removal of carbons present in the TaON thin film, and the inhibition of the oxygen deficiency in the TaON thin film.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a capacitor of a semiconductor device, comprising:

forming a ruthenium film as a lower electrode on a semiconductor substrate;

forming an amorphous TaON thin film on the ruthenium film;

subjecting the resulting substrate to a first thermal treatment;

subjecting the resulting substrate to a second thermal treatment, wherein said amorphous TaON thin film is crystallized to form a crystalline TaON film; and forming an upper electrode on the crystalline TaON film, wherein said first thermal treatment comprises a thermal treatment in a chamber at a pressure ranging from more than 20 Torr to less than 1,000 Torr, wherein a sub-heater in said chamber is maintained at a temperature ranging from 300 to 400° C.; an power ranging from 50 Watts to 400 Watts is applied between a ground of the sub-heater and an electrode of a showerhead; and a treatment time for said first thermal treatment ranging from 1 to 20 minutes.

2. The method of claim 1, wherein the ruthenium film has a thickness ranging from 1,000 to 2,000 Å.

3. The method of claim 1, wherein the amorphous TaON film is formed by reaction of a vapor comprising Ta with $NH_3$ gas in a low pressure chemical vapor deposition (LPCVD) chamber, said LPCVD chamber being maintained at a pressure ranging from 0.1 to 2 Torr and at a temperature ranging from 350 to 450° C., wherein the vapor comprising Ta is obtained by vaporizing a tantalum source comprising tantalum ethylate ($Ta(OC_2H_5)_5$) in a vaporizer, said vaporizer being maintained at a temperature ranging from 170 to 190° C., and wherein the $NH_3$ gas is supplied into the LPCVD chamber at a flow rate ranging from 10 to 1000 SCCM.

4. The method of claim 1, wherein said first thermal treatment further comprises using $O_3$ gas at a concentration ranging from 10,000 ppm to 200,000 ppm, and supplying $NH_3$ gas at a flow rate ranging from 10 SCCM to 1000 SCCM.

5. The method of claim 1, wherein the second thermal treatment comprises subjecting the substrate to a Rapid Thermal Process (RTP) annealing at a temperature ranging from 500 to 600° C. for a time ranging from 30 to 60 seconds using a gas chosen from $N_2$ and $O_2$ at a flow rate ranging from 1 SLM to 10 SLM.

6. The method of claim 1, wherein the upper electrode is chosen from a ruthenium film and a TiN film.

7. A method of fabricating a capacitor of a semiconductor device, comprising:

forming a ruthenium film as a lower electrode on a semiconductor substrate;

forming an amorphous TaON thin film on the ruthenium film;

subjecting the resulting substrate to a first thermal treatment;

subjecting the resulting substrate to a second thermal treatment comprising Rapid Thermal Process (RTP) annealing to crystallize the amorphous TaON thin film and form a crystalline TaON film; and forming an upper electrode on the crystalline TaON film
wherein the first thermal treatment comprises maintaining a chamber at a pressure ranging from more than 20 Torr to less than 1,000 Torr, wherein a sub-heater in said chamber is maintained at a temperature ranging from 300 to 400° C.; an RF power ranging from 50 Watts to 400 Watts is applied between a ground of the sub-heater and an electrode of a showerhead; and a treatment time for said first thermal treatment ranges from 1 to 20 minutes.

8. The method of claim 7, wherein the ruthenium film has a thickness ranging from 1,000 to 2,000 Å.

9. The method of claim 7, wherein the amorphous TaON film is formed by reaction of a vapor comprising Ta with $NH_3$ gas in a low pressure chemical vapor deposition (LPCVD) chamber, said LPCVD chamber being maintained at a pressure ranging from 0.1 to 2 Torr and at a temperature ranging from 350 to 450° C., wherein the vapor comprising Ta is obtained by vaporizing a tantalum source comprising tantalum ethylate ($Ta(OC_2H_5)_5$)) in a vaporizer, said vaporizer being maintained at a temperature ranging from 170 to 190° C., and wherein the $NH_3$ gas is supplied into the LPCVD chamber at a flow rate ranging from 10 to 1000 SCCM.

10. The method of claim 7, wherein said first thermal treatment further comprises using $O_3$ gas at a concentration of 10,000 ppm to 200,000 ppm, and supplying $NH_3$ gas at a flow rate ranging from 10 SCCM to 1000 SCCM.

11. The method of claim 7, wherein the second thermal treatment comprises subjecting the substrate to an RTP annealing at a temperature ranging from 500 to 600° C. for a time ranging from 30 to 60 seconds using a gas chosen from $N_2$ and $O_2$ at a flow rate ranging from 1 SLM to 10 SLM.

* * * * *

UNITED STATES PATENT AND TRADEMARK OFFICE
CERTIFICATE OF CORRECTION

PATENT NO. : 6,716,717 B2
DATED : April 6, 2004
INVENTOR(S) : Kim et al.

It is certified that error appears in the above-identified patent and that said Letters Patent is hereby corrected as shown below:

Title page,
Item [*] Notice, should read as follows -- Subject to any disclaimers, the term of this patent is extended or adjusted under U.S.C. 154(b) by 239 days. --

Signed and Sealed this

Fifth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,716,717 B2
DATED : April 6, 2004
INVENTOR(S) : Kyong Min Kim et al.

It is certified that error appears in the above-identified patent and that said Letters Patent is hereby corrected as shown below:

Column 4,
Line 23, "an power" should read -- an RF power --.

Signed and Sealed this

Tenth Day of May, 2005

JON W. DUDAS
*Director of the United States Patent and Trademark Office*